US010510906B2

(12) United States Patent
Liu et al.

(10) Patent No.: US 10,510,906 B2
(45) Date of Patent: Dec. 17, 2019

(54) MOS CAPACITOR, SEMICONDUCTOR FABRICATION METHOD AND MOS CAPACITOR CIRCUIT

(71) Applicant: TAIWAN SEMICONDUCTOR MANUFACTURING COMPANY LTD., Hsinchu (TW)

(72) Inventors: Szu-Lin Liu, Hsinchu (TW); Jaw-Juinn Horng, Hsinchu (TW); Yung-Chow Peng, Hsinchu (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 15/200,424

(22) Filed: Jul. 1, 2016

(65) Prior Publication Data
US 2018/0006163 A1   Jan. 4, 2018

(51) Int. Cl.
| | |
|---|---|
| *H01L 29/94* | (2006.01) |
| *H01L 21/265* | (2006.01) |
| *H01L 21/266* | (2006.01) |
| *H01L 29/08* | (2006.01) |
| *H01L 29/66* | (2006.01) |
| *H03K 17/687* | (2006.01) |

(52) U.S. Cl.
CPC ........... *H01L 29/94* (2013.01); *H01L 21/266* (2013.01); *H01L 21/26506* (2013.01); *H01L 29/0847* (2013.01); *H01L 29/66181* (2013.01); *H03K 17/687* (2013.01)

(58) Field of Classification Search
CPC ................ H01L 29/94; H01L 29/0653; H01L 29/66181
USPC ....................................................... 257/532
See application file for complete search history.

(56) References Cited

U.S. PATENT DOCUMENTS

| | | | | |
|---|---|---|---|---|
| 6,034,388 A | * | 3/2000 | Brown | H01L 21/76237 257/296 |
| 6,049,213 A | * | 4/2000 | Abadeer | G01R 31/2879 324/537 |
| 8,450,832 B2 | * | 5/2013 | Sarkar | H01L 29/93 257/532 |
| 2002/0074589 A1 | * | 6/2002 | Benaissa | H01L 27/0808 257/312 |
| 2002/0140109 A1 | * | 10/2002 | Keshavarzi | H01L 27/0805 257/782 |
| 2005/0083075 A1 | * | 4/2005 | Su | G01R 31/2648 324/754.28 |

(Continued)

*Primary Examiner* — Lex H Malsawma
*Assistant Examiner* — Eric W Jones
(74) *Attorney, Agent, or Firm* — WPAT, P.C., Intellectual Property Attorneys; Anthony King

(57) ABSTRACT

A metal-oxide-semiconductor (MOS) capacitor is disclosed. The MOS capacitor includes a front-end-of-the-line (FEOL) field effect transistor (FET), and a plurality of middle-end-of-the-line (MEOL) conductive structures. The FEOL FET includes a source region and a drain region positioned in a semiconductor substrate, and a gate over the semiconductor substrate. The plurality of MEOL conductive structures is disposed on a top surface of the gate. At least one of the MEOL conductive structures is electrically disconnected from a back-end-of-the-line (BEOL) metal layer. A semiconductor fabrication method and a MOS capacitor circuit are also disclosed.

17 Claims, 11 Drawing Sheets

(56) References Cited

U.S. PATENT DOCUMENTS

| | | | |
|---|---|---|---|
| 2005/0176195 A1* | 8/2005 | Shih | H01L 27/0251 |
| | | | 438/197 |
| 2008/0308837 A1* | 12/2008 | Gauthier, Jr. | H01L 27/0262 |
| | | | 257/107 |
| 2011/0204969 A1* | 8/2011 | Chen | H01L 29/7391 |
| | | | 327/581 |
| 2013/0260486 A1* | 10/2013 | Huang | H01L 29/93 |
| | | | 438/18 |
| 2015/0162323 A1* | 6/2015 | Taya | H01L 27/0629 |
| | | | 257/296 |
| 2015/0318273 A1* | 11/2015 | Lue | H01L 27/0629 |
| | | | 257/296 |
| 2017/0069766 A1* | 3/2017 | Park | H01L 29/66181 |
| 2017/0301675 A1* | 10/2017 | Harjani | H01L 27/10805 |

\* cited by examiner

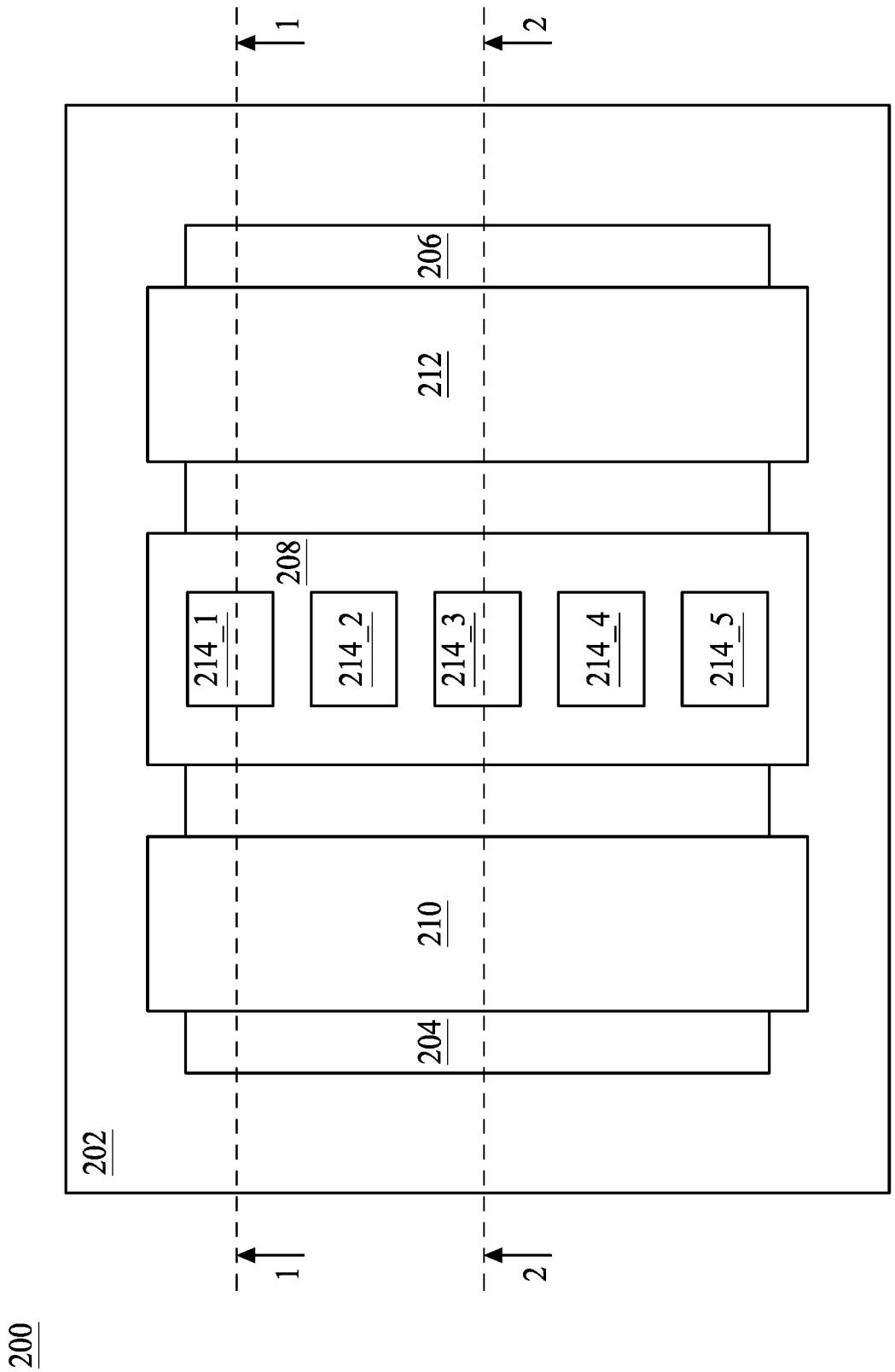

MOS CAPACITOR, SEMICONDUCTOR FABRICATION METHOD AND MOS CAPACITOR CIRCUIT

BACKGROUND

Power supply noise, simultaneous switching noise, or dynamic switching noise, is one of the most significant noise problems in deep sub-micron integrated circuits. The problem stems from switching noise on the power supply lines that are coupled from other signal nodes.

The most effective way to reduce power supply noise, however, is to use decoupling capacitors to filter out noise coupling between a positive supply voltage and a complimentary lower supply voltage. Such power noises may be induced by transistors in a high density IC demanding a large current with a high frequency, which results in abrupt voltage drops. There can be both global and localized voltage drops on the power grid of the IC. This voltage drop can be reduced by providing localized current sources. For example, capacitors may be used to decouple current surges from the power grid, and thereby reducing noise on the power grid.

Existing decoupling capacitors have disadvantages of having lower capacitance per area and having substantial gate leakage. The capacitance density and leakage current are trade-off in general; MOS capacitors with thick gate-oxide typically usually have lower current leakage and lower capacitance density as well. Therefore, what is needed is a decoupling capacitor having reduced leakage, but that maintains high capacitance per area and compatibility with standard complementary metal-oxide-semiconductor (CMOS) cells. Since power supply voltage substantially reduces with technology scaling down, the MOS capacitor having thin gate-oxide has become a potential choice. The present disclosure addresses such a need.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 2 is a top layout view of an illustrative decoupling capacitor according to an embodiment of the present disclosure;

DETAILED DESCRIPTION

Figure 1:
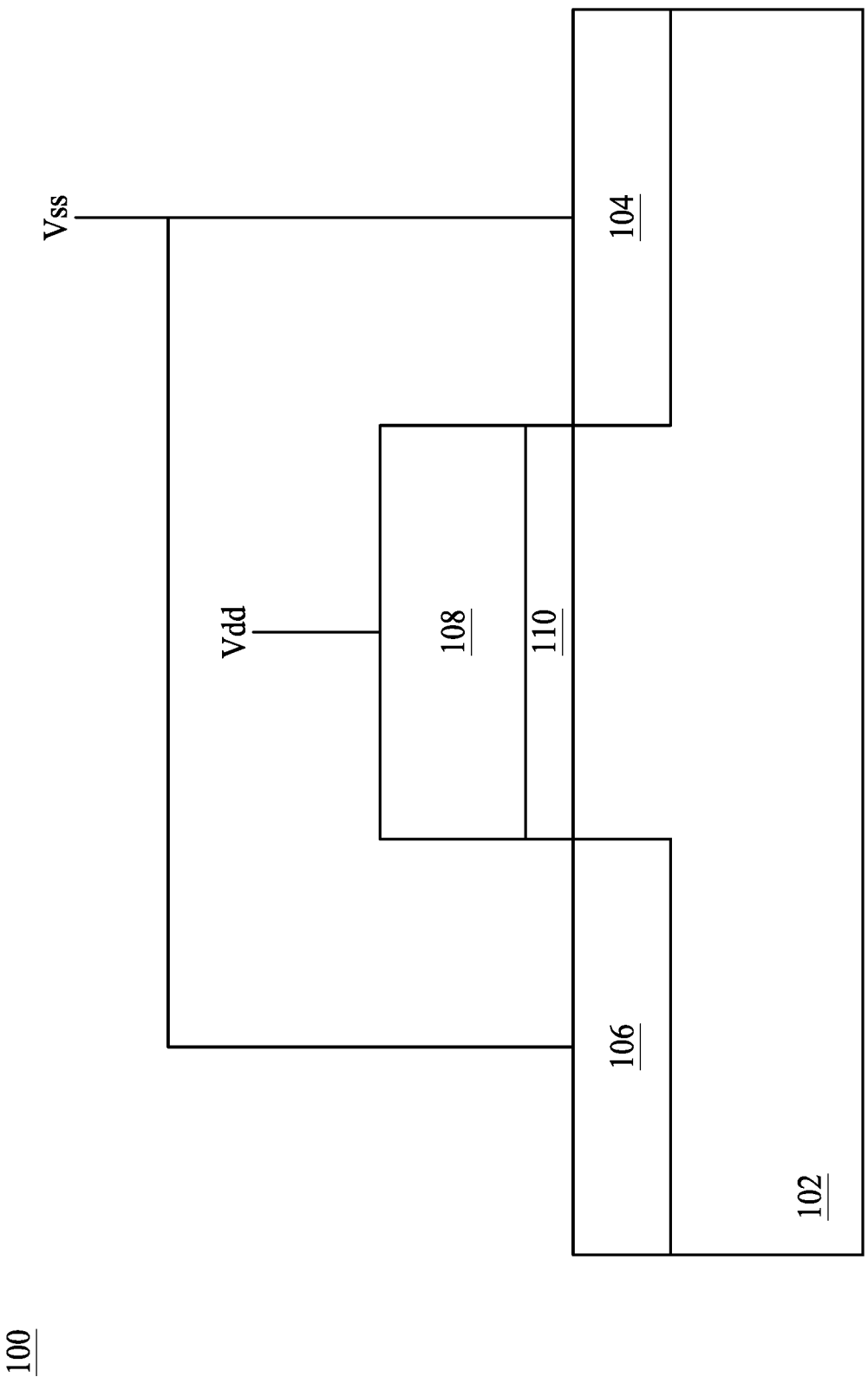
FIG. 1 is a schematic view of an n-type MOS decoupling capacitor according to an embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

Introduction to Decoupling Capacitors

The amount of power drawn from a power supply may vary during normal operation of an integrated circuit. To accommodate this type of changing power demand while maintaining constant power supply voltage levels, the integrated circuit may include decoupling capacitor circuitry. The decoupling capacitor circuitry may serve as a local energy storage reserve that provides instantaneous current draw. Providing current using the decoupling capacitor circuitry may reduce power supply noise.

An integrated circuit may include, for example, memory chips, digital signal processing circuits, microprocessors, application specific integrated circuits, programmable integrated circuits, or other suitable integrated circuits. Normally, a plurality of decoupling capacitor blocks including decoupling capacitor circuitry of varying configurations (e.g., decoupling capacitor blocks of different sizes and shapes) may be formed on the integrated circuit. The decoupling capacitor circuitry may be formed from combinations of different types of capacitors (e.g. thin oxide capacitors and thick oxide capacitors). Depending on requirements, the decoupling capacitor blocks may be formed in many locations (e.g. adjacent to I/O circuitry, as an integral part of I/O circuitry, adjacent to circuits that are sensitive to power supply variation, or at any desired location on device). Tens or hundreds of decoupling capacitor blocks may be formed on the integrated circuit, if desired.

The decoupling capacitor blocks may serve to reduce power supply variation at the respective locations on the integrated circuit. For example, consider a scenario in which an external power source supplies a 1.2 V positive power supply voltage to the integrated circuit. The integrated circuit may include a communications circuitry operating at high data rates (e.g., data rates greater than 1 Gbps). During an idle mode, the communications circuitry may draw 0.5 A of current from the power source (as an example). During a transmit mode, the communications circuitry may draw 0.7 A of current from the power source. During the mode switch from the idle mode to the transmit mode, the decoupling capacitor block located adjacent to the communications circuitry on the integrated circuit may serve to provide 0.2 A of current (0.7-0.5) so that the communications circuitry receives a constant positive supply voltage of 1.2 V.

Consider another scenario in which the positive power supply experiences an instantaneous voltage glitch. The decoupling capacitor blocks may dampen or absorb this glitch by providing instantaneous current to internal circuitry so that the positive power supply voltage received at the local power supply terminal of the circuitry remains constant at 1.2 V (as an example).

The decoupling capacitor blocks formed on the integrated circuit may have large dimensions. For example, a single decoupling capacitor array may measure 400 μm by 200 μm and may have one hundred or more, one thousand or more, or ten thousand or more individual capacitor cells. The size of the decoupling capacitor blocks in modern integrated circuits may occupy a significant percentage of the available die area (e.g., from 20 to 30 percent or more chip area of an analog intellectual property (IP)).

FIG. 1 is a schematic view of an n-type MOS decoupling capacitor 100 according to an embodiment of the present disclosure. A gate material 108 is coupled to a positive voltage supply Vdd. Source/drain regions 106 and 104 are disposed in a P-well diffusion region 102. The source/drain regions 106 and 104 are coupled to a complimentary lower voltage supply Vss. A gate oxide 110 provides dielectric material for the n-type MOS decoupling capacitor 100, which operates at inversion region where the capacitance is higher under the aforementioned connection. But using gate oxide to form the n-type MOS decoupling capacitor 100 suffers high leakage current tunneling through the gate oxide, especially in modern semiconductor devices where gate oxide is becoming ever thinner.

MEOL Conductive Structure Configuration in MOS Decoupling Capacitor

FIG. 2 is a top layout view of an illustrative decoupling capacitor 200 according to an embodiment of the present disclosure. As shown in FIG. 2, the decoupling capacitor 200 includes a semiconductor substrate 202, a gate material 208, a source region 204 and a drain region 206. The source and drain regions, 204 and 206, of the decoupling capacitor 200 are interchangeable and sometimes collectively referred to herein as source-drain regions. The gate material 208 and the source-drain regions 204 and 206 are fabricated with a front-end-of-the-line (FEOL) process followed by a middle-end-of-the-line (MEOL) process and a back-end of line (BEOL) process. Herein, the MEOL process refers to forming connections between FEOL devices and the lowest BEOL metallization level (M1) such as conductive structures including device contacts and via interconnects. In FIG. 2, source-drain conductive structures 210 and 212 fabricated with the MEOL process are disposed on the source-drain regions 204 and 206 respectively. In addition, a plurality of gate conductive structures 214_1-241_5 fabricated with the MEOL process is disposed on the gate material 208.

The decoupling capacitor 200 is configured to reduce power supply noise between a positive voltage supply Vdd and a complimentary lower voltage supply Vss. In this embodiment, the source-drain conductive structures 210 and 212 are coupled to the voltage Vss through vias (The reversed connection is also workable in some embodiments, which is not shown in FIG. 2), and at least one of the gate conductive structures 214_1-214_5 is electrically connected to the voltage supply Vdd through at least one via (not shown in FIG. 2). For instance, in this embodiment, the gate conductive structure 214_3 is electrically connected to the voltage supply Vdd through a via. The gate conductive structures 214_1-214_5 may be in rectangular shape. However, this is not a limitation of the present disclosure. In some embodiments, the gate conductive structures 214_1-214_5 may be in circular or oval shape. In some embodiments, a top surface of each of the gate conductive structures 214_1-214_5 and a top surface of the source-drain conductive structures 210 and 212 are at a same altitude level. So that a greater capacitance can be incurred between sidewalls of the source-drain conductive structures 210 and 212 and the gate conductive structures 214_1-214_5. In some embodiments, a top surface of each of the gate conductive structures 214_1-214_5 and a top surface of the source-drain conductive structures 210 and 212 are at a different altitude level.

Figure 3A:
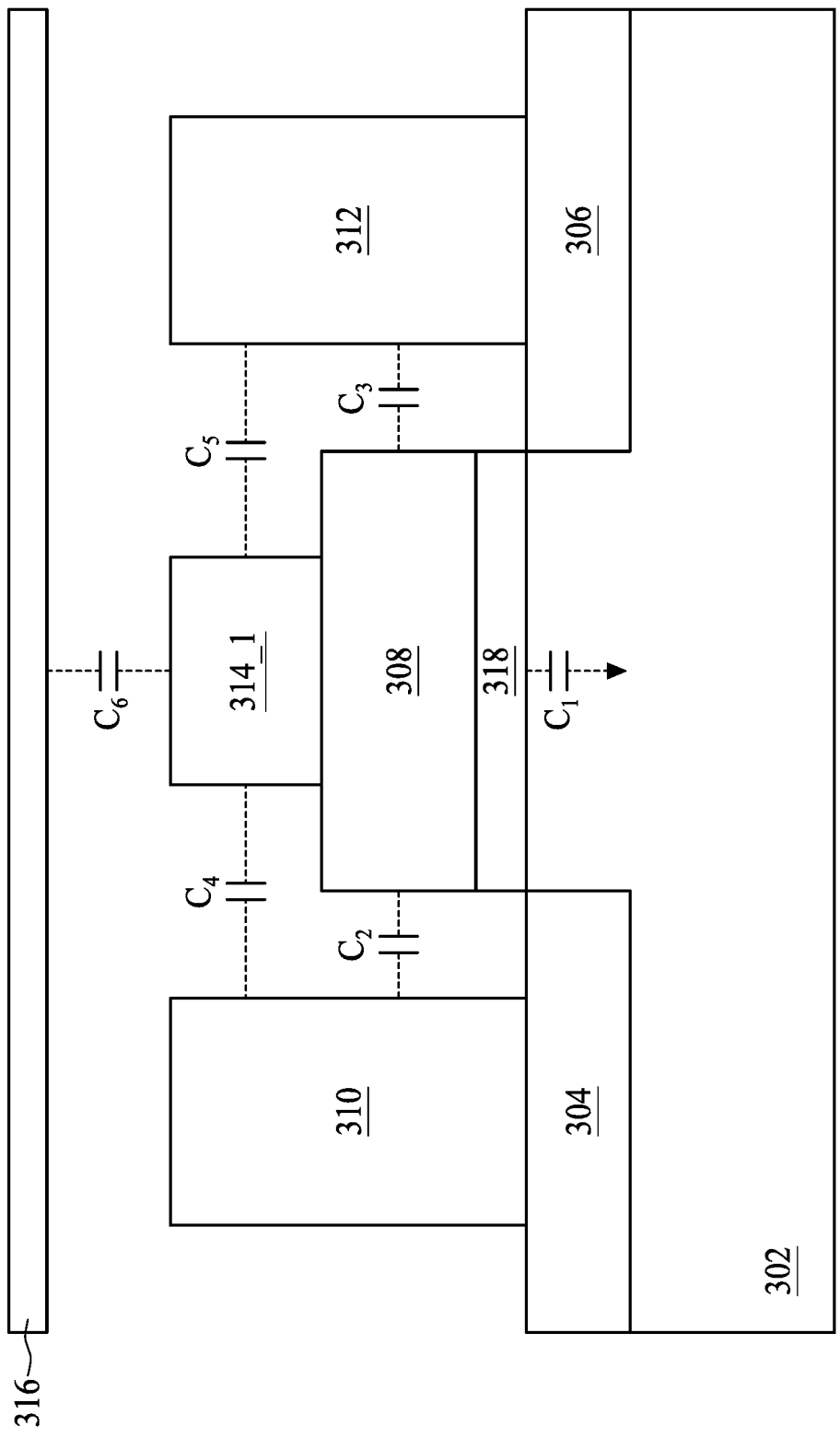
FIG. 3(a) is schematic view of a decoupling capacitor taken along the lines 1-1 of FIG. 2.
Figure 3B:
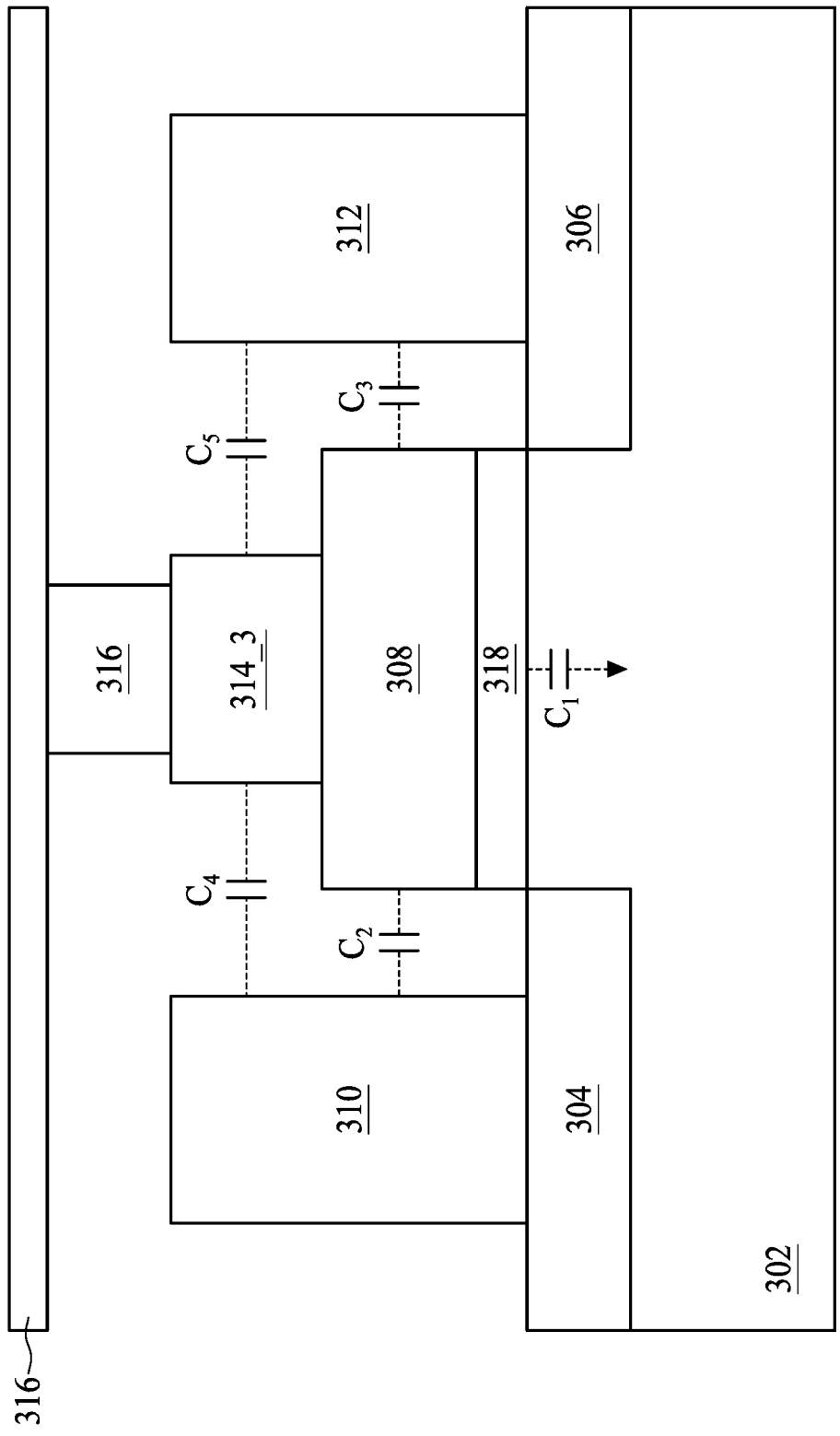
FIG. 3(b) is schematic view of a decoupling capacitor taken along the lines 2-2 of FIG. 2.

Although a portion of the gate conductive structures 214_1-214_5 are not electrically connected to the voltage supply Vdd through a via, but the unconnected gate conductive structures are still capable of providing additional parasitic capacitance, and not incurring further gate leakage in the meantime, which detail is described below. In order to incur more parasitic capacitance, at least 20% of the top surface of the gate material 208 is covered by the gate conductive structures 214_1-214_5. In some embodiments, more than 50% of the top surface of the gate material 208 is covered by the gate conductive structures 214_1-214_5. FIG. 3(a) is schematic view of a decoupling capacitor 300 taken along the lines 1-1 of FIG. 2. FIG. 3(b) is schematic view of the decoupling capacitor 300 taken along the lines 2-2 of FIG. 2. The decoupling capacitor 300 includes a semiconductor substrate 302 corresponding to the semiconductor substrate 202; a gate material 308 corresponding to the gate material 208; a source region 304 and a drain region 306 corresponding to a source region 204 and a drain region 206 of the decoupling capacitor 200; and source-drain conductive structures 310 and 312 corresponding to the source-drain conductive structures 210 and 212. Further, a gate conductive structure 314_1 shown in FIG. 3(a) corresponds to the gate conductive structures 214_1; and a gate conductive structures 314_3 shown in FIG. 3(b) corresponds to the gate conductive structures 214_3. A metal line 316 located in the lowest BEOL is also illustrated in FIGS. 3(a) and 3(b). Also be noted that surface 314a and surface 314b respectively indicates the top surface of the gate conductive structure 314_1 and gate conductive structure 314_3. Surface 310a and surface 312a respectively indicates the top surface of source-drain conductive structures 310 and 312. In some embodiments, all the top surfaces are at a same altitude level.

As shown in the example of FIG. 3(a), the capacitance of decoupling capacitor 300 may include 6 capacitances, C1, C2, C3, C4, C5 and C6. Capacitance C1 may represent an intrinsic capacitance that is present between the gate material 308 and the surface of substrate 302 directly below gate material 308. For example, if the well diffusion region is biased at the voltage Vdd, the application of the voltage Vss to the gate material 308 may result in the formation of an accumulation region under an oxide layer 318. Capacitance C1 may be dependent on the thickness of the oxide layer 318 and the layout area of gate material 308.

Capacitors C2 and C3 may represent parasitic coupling capacitances that exist between the source-drain conductive structures 310, 312 and the gate material 308. The parasitic capacitances of C2 and C3 may depend on a distance between the gate material 308 and the source-drain conductive structures 310, 312 (e.g. capacitances C2 and C3 may be inversely proportional to the distance between the gate material 308 and the source-drain conductive structures 310, 312). For example, if the distance between the gate material 308 and the source-drain conductive structures 310, 312 is increased, then capacitances C2 and C3 will decrease. Conversely, if the distance between the gate material 308 and the source-drain conductive structures 310, 312 is decreased, then capacitances C2 and C3 will increase.

Capacitors C4 and C5 may represent parasitic coupling capacitances that exist between the source-drain conductive structures 310, 312 and the gate conductive structures 314_1, 314_3 formed on the gate material 308. The parasitic capacitances of C4 and C5 may depend on a distance between the gate conductive structures 314_1, 314_3 and the source-drain conductive structures 310, 312. A capacitor C6 may represent parasitic coupling capacitances that exist between the gate conductive structures 314 formed on the gate material 308 and the metal line 316 of the lowest BEOL metallization level. The parasitic capacitance of C6 may depend on a distance between the gate conductive structures 314_1 and the metal line 316. In some embodiments, in order to increase the capacitor C6, the metal line routing in the lowest BEOL metallization level (M1) may be intentionally made winding above the gate conductive structures 314_1, for example, in a zig-zag way. Therefore the chance to incur capacitance of the capacitor C6 is increased. Please note that in FIG. 3(b), the gate conductive structures 314_3 is electrically connected to the metal line 316 through a via 316.

Using conductive structures 210, 212 and 214_1-214_5 to increase the total capacitance of the decoupling capacitor 200 may therefore increase the capacitance per unit area of the decoupling capacitor 200. This allows a circuit designer to reduce the area of each decoupling capacitor block while still providing sufficient decoupling capacitance, thereby freeing up valuable integrated circuit real estate for other operational circuitry. To put it another way, disposing the dummy gate conductive structures 214_1-214_5 more or less increases the lateral side and top side parasitic capacitance. Configuring the gate conductive structure 214_1-214_5 to have substantial the same height to the side neighboring source-drain conductive structures 210 and 212 further incidentally reduces gate material 208 extension out of 204.

Figure 4:
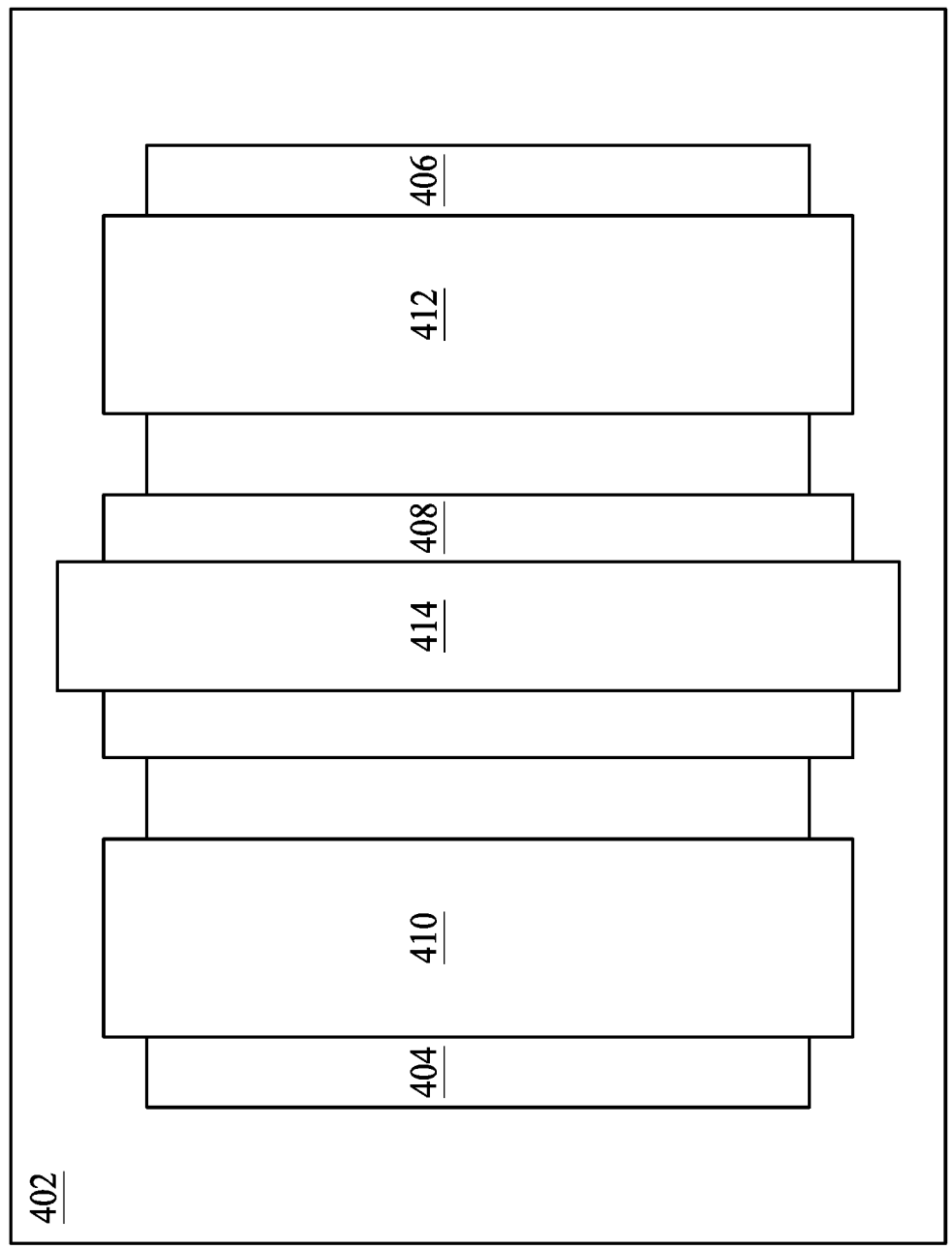
FIG. 4 is a top layout view of an illustrative decoupling capacitor according to another embodiment of the present disclosure.

The gate conductive structures 214_1-214_5 formed in other dimensions and/or configurations also fall within the contemplated scope of the present disclosure. FIG. 4 is a top layout view of an illustrative decoupling capacitor 400 according to another embodiment of the present disclosure. As shown in FIG. 4, the decoupling capacitor 400 includes a semiconductor substrate 402, a gate material 408, a source region 404 and a drain region 406 similar to the decoupling capacitor 200 shown in FIG. 2. A gate conductive structure 414 fabricated with the MEOL process is disposed on the gate material 408, wherein an edge of the gate conductive structure 414 laterally exceeds an edge of the gate material 408. Similarly, in order to incur more parasitic capacitance, at least 20% of the top surface of the gate material 408 is covered by the gate conductive structure 414.

Non-Doped or Lightly-Doped MOS Decoupling Capacitor

The existing MOS structure is obtained by growing a layer of dielectric on top of a substrate and depositing a layer of metal or polycrystalline silicon (the latter is commonly used).

The most important property of the MOS capacitor is that its capacitance changes with an applied DC voltage. As a result, the modes of operation of the MOS capacitor change as a function of the applied voltage. As a DC voltage is applied to the gate terminal, it causes the device to pass through accumulation, depletion, and inversion regions.

When a positive voltage is applied between the gate terminal and the substrate of an n-type MOS capacitor, the majority carriers are replaced from the semiconductor-oxide interface. This state of the semiconductor is called depletion because the surface of the semiconductor is depleted of majority carriers. This area of the semiconductor acts as a dielectric because it can no longer contain or conduct charge. In effect, it becomes a semi-insulator.

For an n-type MOS capacitor, the total measured capacitance now becomes the oxide capacitance and the depletion layer capacitance in series, and as a result, the measured capacitance decreases. As a gate voltage increases, the depletion region moves away from the gate terminal, increasing the effective thickness of the dielectric between the gate terminal and the substrate, thereby reducing the capacitance.

As the gate voltage of an N-type MOS capacitor increasing beyond the threshold voltage, dynamic carrier generation and recombination move toward net carrier generation. The positive gate voltage generates electron-hole pairs and attracts electrons toward the gate terminal. Again, because the gate dielectric is an insulator, these minority carriers accumulate at the substrate-to-oxide/well-to-oxide interface. The accumulated minority-carrier layer is called the inversion layer because the carrier polarity is inverted. Above a certain positive gate voltage, most available minority carriers are in the inversion layer, and further gate voltage increases do not further deplete the semiconductor. That is, the depletion region reaches a maximum depth.

Once the depletion region reaches a maximum depth, the capacitance that is measured by the high frequency capacitance meter is the oxide capacitance in series with the maximum depletion capacitance. This capacitance is often referred to as minimum capacitance. The C-V curve slope is almost flat.

Figure 5:
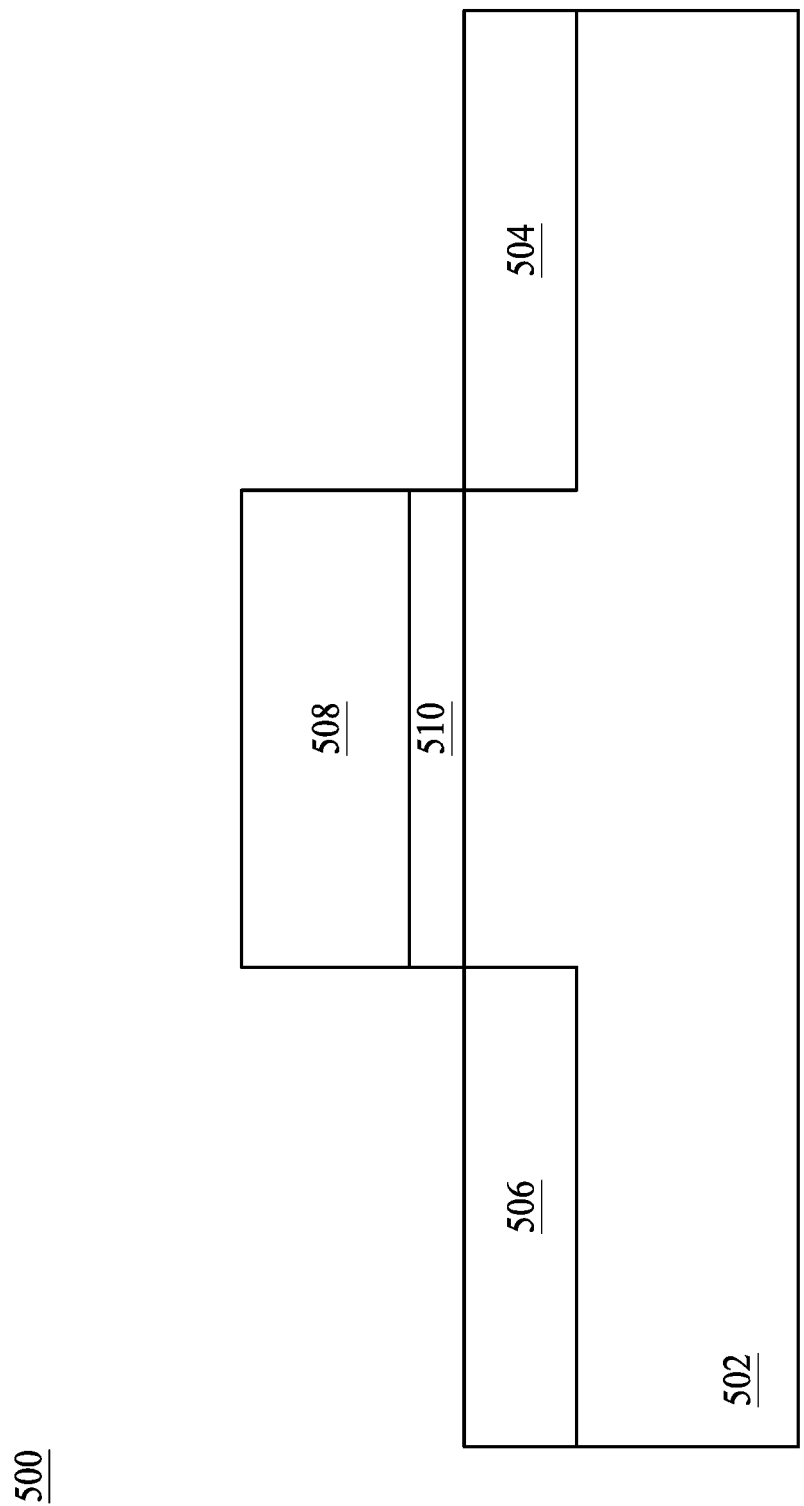
FIG. 5 is a schematic view of a non-doped n-type MOS decoupling capacitor according to an embodiment of the present disclosure.

As a consequence, one of the concepts of the present disclosure is to reduce the threshold voltage of the MOS capacitor, so that the inversion layer emerges faster and easier. FIG. 5 is a schematic view of a non-doped n-type MOS decoupling capacitor 500 according to an embodiment of the present disclosure. Source/drain regions 506 and 504 are disposed in a P-well diffusion region 502. The source/drain regions 506 and 504 are coupled to a complimentary lower voltage supply Vss. A gate oxide 510 provides dielectric material for the n-type MOS decoupling capacitor 500, which operates at inversion region where the capacitance is higher under the aforementioned connection. Since drain and source has same voltage for decoupling capacitor, there is no drain-source leakage issue.

The n-type MOS decoupling capacitor 500 is free from P+ implantation operation during fabrication and has no channel region. In this way, when the n-type MOS decoupling capacitor 500 operates as a MOS capacitor, the vertical electric filed under the gate material 508 is reduced, and increased capacitance at the gate dielectric 510 can be therefore obtained even under a lower bias. The non-doped structure may be also applied to a p-type MOS decoupling capacitor. In some embodiments, the implantation operation still exists, but the dosage and/or recipe of implantation is modified in order to reduce a channel region and produce a lightly doped n-type MOS, and this alternative structure also fall within the contemplated scope of the present disclosure.

Figure 6:
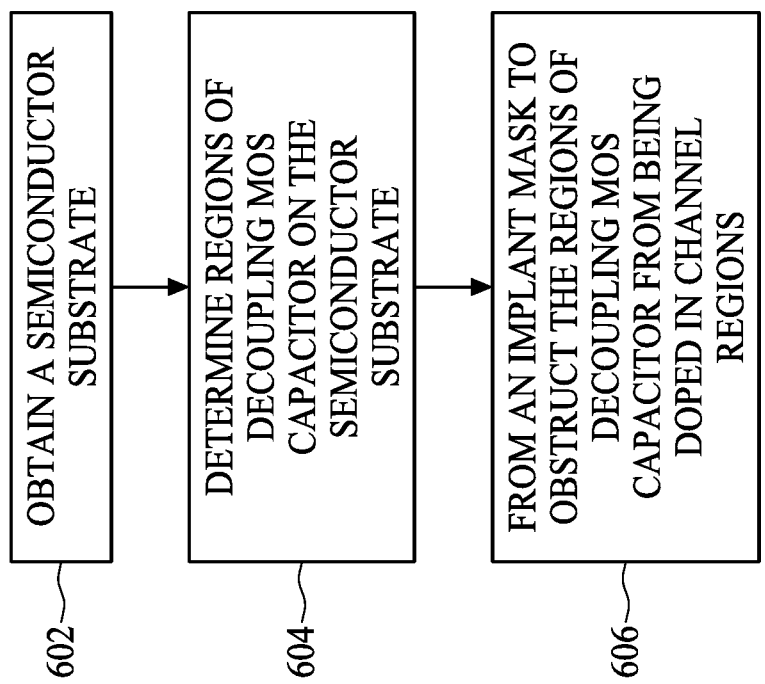
FIG. 6 is a flow chart illustrating a semiconductor fabrication method according to an embodiment of the present disclosure.

FIG. 6 is a flow chart illustrating a semiconductor fabrication method according to an embodiment of the present disclosure. In operation 602, a semiconductor substrate is obtained. The semiconductor substrate is planned to fabricate a plurality of MOS decoupling capacitor blocks and other integrated circuits thereon. Some operations prior to the channel region implantation may already take place on the semiconductor substrate. In operation 604, regions of MOS decoupling capacitor on the semiconductor substrate is determined and identified on the layout prior to a channel region implantation operation. Based on the determination regions of MOS decoupling capacitor, an implant mask is therefore formed on the semiconductor substrate by operation 606 to obstruct the regions of the MOS decoupling capacitor from being doped in a channel region of each MOS decoupling capacitor. In other words, the channel region is only produced in the integrated circuit other than the regions of the MOS decoupling capacitor.

Accumulation Mode MOS Decoupling Capacitor

As discussed in the previous paragraphs, using a gate oxide to form a decoupling capacitor in the inversion mode suffers high leakage current tunneling through the gate oxide. One of the concepts of the present disclosure is to operate the MOS capacitor under an accumulation mode.

With no voltage applied, a p-type semiconductor has holes as majority carriers. When a negative voltage over negative threshold voltage is applied between the gate material and the semiconductor, more holes will accumulate at the oxide-semiconductor interface. This is because the negative charge of the gate material causes an equal net positive charge to accumulate at the interface between the semiconductor and the gate dielectric. This state of the p-type semiconductor is called accumulation. For the MOS capacitor with n-type semiconductor, the accumulation operation needs a positive voltage between the gate material and the semiconductor, and the carriers in accumulation are electrons.

When the MOS capacitor operates in the accumulation mode, carriers are provided by the semiconductor body instead of the source/drain regions. In this situation, the MOS capacitor of accumulation mode saves about 90% of the leakage current compared with the MOS capacitor of conventional inversion mode. Further, at least a portion of the source/drain regions may be disconnected from the voltage supply to save more leakage current. In some embodiments with such a configuration, about 95% of the leakage current may be saved compared with the MOS capacitor of conventional inversion mode.

Figure 7:
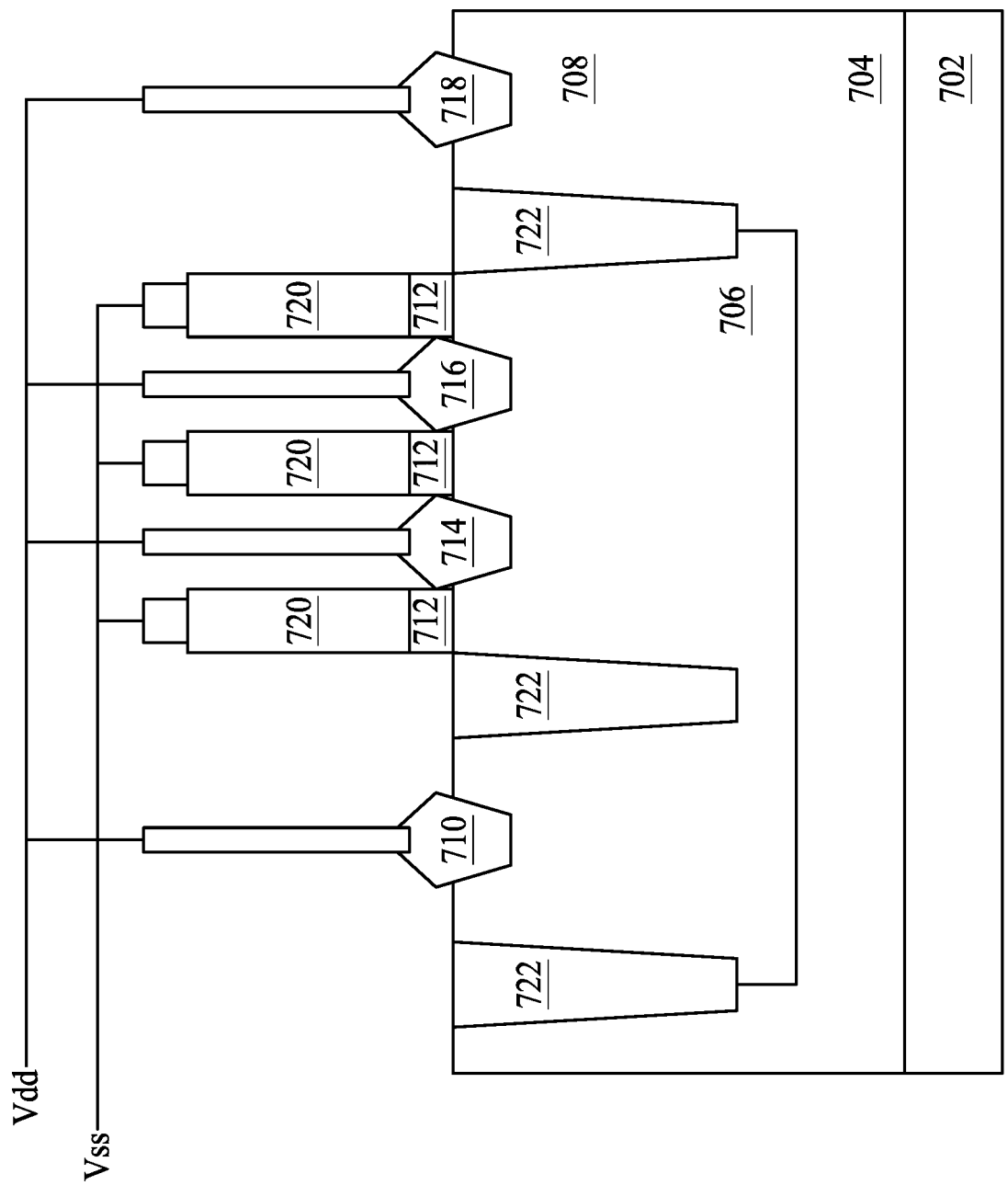
FIG. 7 is a schematic view of an n-type MOS decoupling capacitor operating in an accumulation mode according to an embodiment of the present disclosure.

FIG. 7 is a schematic view of an n-type MOS decoupling capacitor 700 operating in an accumulation mode according to an embodiment of the present disclosure. As shown in FIG. 7, a deep n-well diffusion region 704 is formed in a p-type substrate 702. A p-well diffusion region 706 is formed in an n-well diffusion region 708. In some embodiment, other body forming techniques may be employed. For example, single-well processes are possible for use with the present disclosure. The MOS capacitor 700 according to this embodiment of the inventive technique includes the p-well diffusion region 706 as one plate (the "lower" plate) of the capacitor 700. This plate is connected to a positive voltage supply Vdd by at least one p+ doped conductive region 710. The n-well diffusion region 708 is connected to a positive voltage supply Vdd by at least one n+ doped conductive region 718 being shown in FIG. 7. The source/drain regions 714 and 716 are also connected to the positive voltage supply Vdd.

The other plate (the "upper" plate) of the n-type MOS decoupling capacitor 700 is formed by gate materials 720. The upper plate composed of the gate materials 720 is connected to a complimentary lower voltage supply Vss, in this embodiment. The edges of the upper capacitor plate are optionally isolated by shallow trench isolations (STI) 722 from the adjacent n-well diffusion region 708. This reduces the likelihood of shorts between this plate and the n+ doped conductive regions 718, which would short out the capacitor.

Note that in operation, positive charges accumulate immediately under gate dielectrics 712, due to the polarity of the voltages applied to the capacitor plates, and the fact that the lower plate is formed in a p-type region. The configuration of the positive voltage supply Vdd and the complimentary lower voltage supply Vss in FIG. 7 is opposite to those operate in the inversion mode. Since the lower voltage supply Vss is applied to the gate materials 720. The tunneling effect between the gate and channel can be significantly mitigated.

Figure 8:
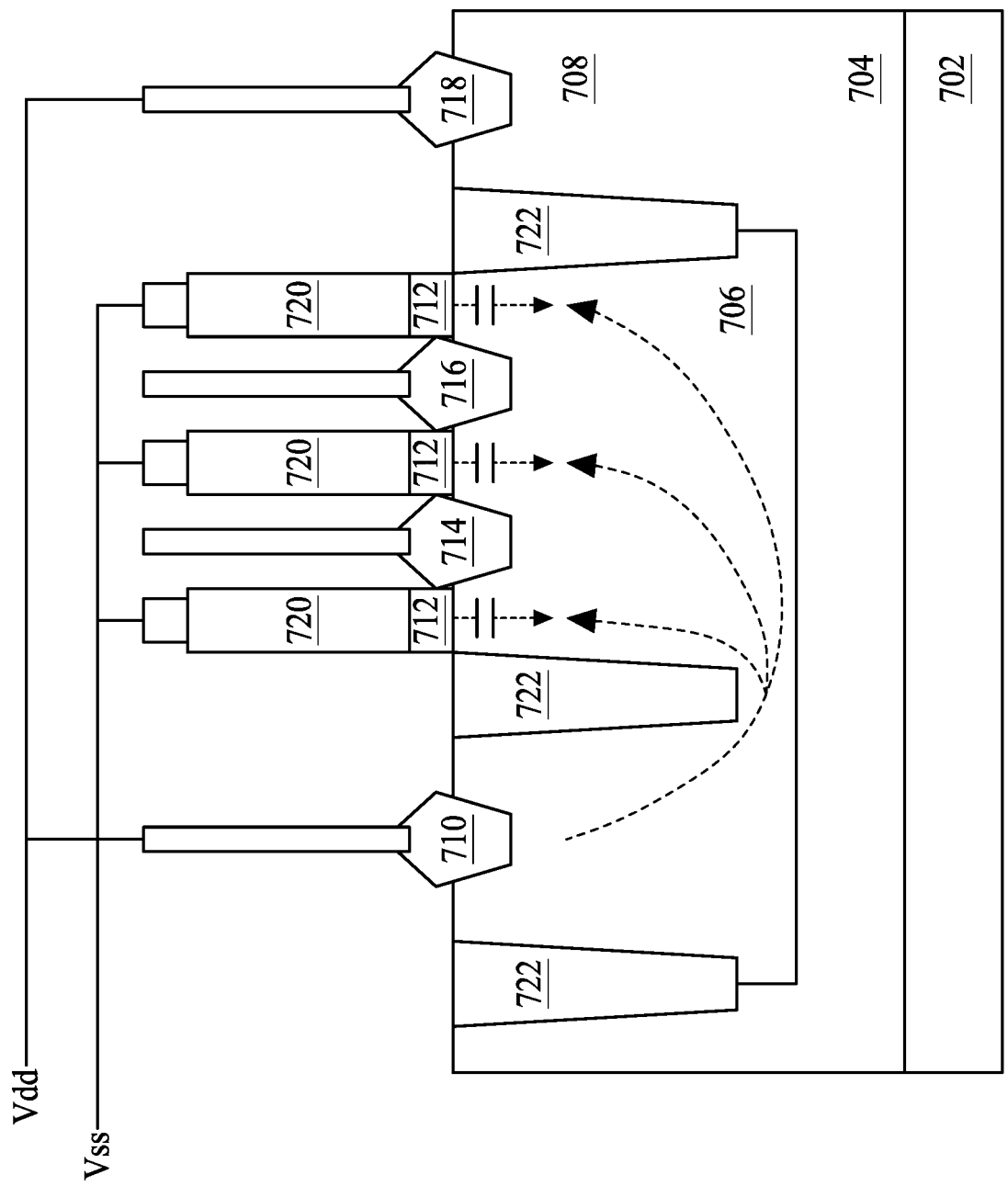
FIG. 8 is a schematic view of an n-type MOS decoupling capacitor operating in an accumulation mode according to another embodiment of the present disclosure.

FIG. 8 is a schematic view of an n-type MOS decoupling capacitor 800 operating in an accumulation mode according to another embodiment of the present disclosure. The n-type MOS decoupling capacitor 800 is generally like the n-type MOS decoupling capacitor 700 except that the source/drain regions 714 and 716 are not connected to the positive voltage supply Vdd. The floating of the source/drain regions 714 and 716 can further reduce the leakage current compared with the configuration shown in FIG. 7.

Figure 9:
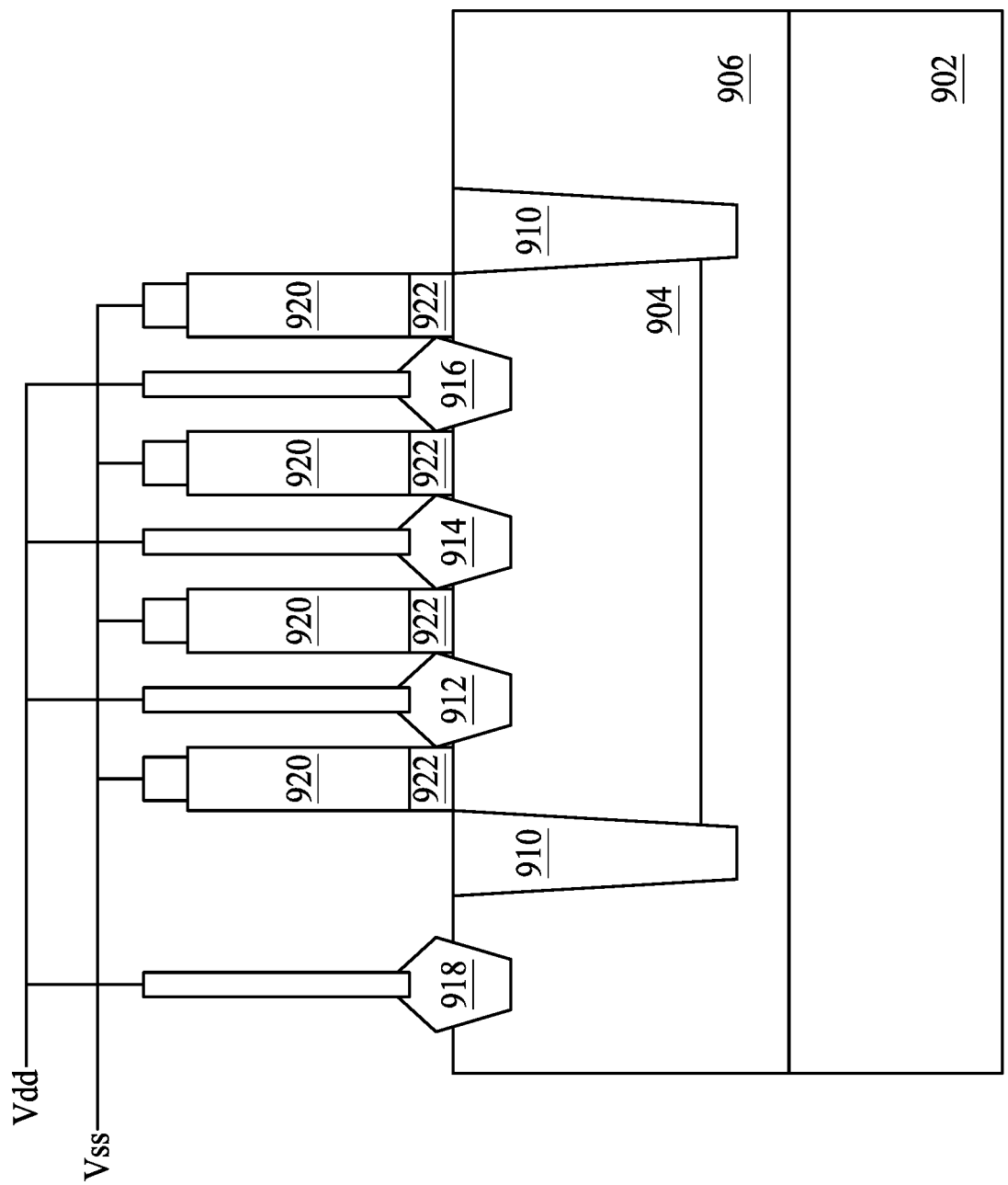
FIG. 9 is a schematic view of an n-type MOS decoupling capacitor operating in an accumulation mode according to still another embodiment of the present disclosure.

FIG. 9 is a schematic view of an n-type MOS decoupling capacitor 900 operating in an accumulation mode according to still another embodiment of the present disclosure. As shown in FIG. 9, an n-well diffusion region 906 is formed in a p-type substrate 902. A p-well diffusion region 904 is formed in the n-well diffusion region 906. In some embodiment, other body forming techniques may be employed. For example, single-well processes are possible for use with the present disclosure. The capacitor 900 according to this embodiment of the inventive technique includes the p-well diffusion region 904 as one plate (the "lower" plate) of the capacitor 900. This plate is connected to a positive voltage supply Vdd by $p^+$ doped conductive regions 912, 914 and 916. The n-well diffusion region 906 is also connected to a positive voltage supply Vdd by at least one $n^+$ doped conductive region 918 being shown in FIG. 9.

The other plate (the "upper" plate) of the decoupling capacitor 900 is formed by gate materials 920. The upper plate composed of the gate materials 920 is connected to a complimentary lower voltage supply Vss, in this embodiment. The edges of the upper capacitor plate are optionally isolated by shallow trench isolations 910 from the adjacent n-well diffusion region 906. This reduces the likelihood of shorts between this plate and the $n^+$ doped conductive regions 918, which would short out the capacitor.

Figure 10:
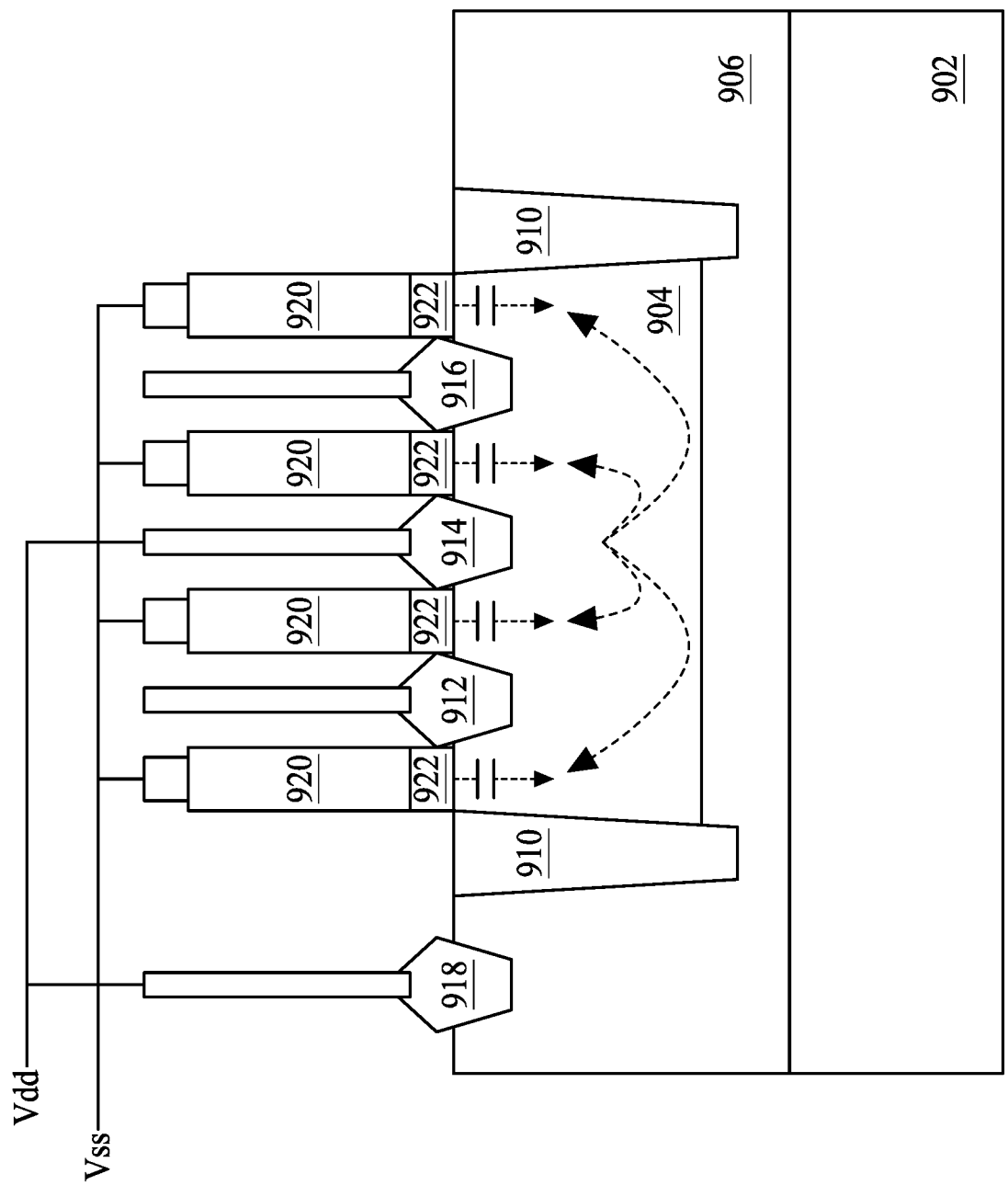
FIG. 10 is a schematic view of an n-type MOS decoupling capacitor operating in an accumulation mode according to still further another embodiment of the present disclosure.

The operation of the decoupling capacitor 900 is similar to the capacitor 700 shown in FIG. 7, thus details are omitted here for brevity. In order to further reduce leakage current, a portion of the $p^+$ doped conductive regions 912, 914 and 916 may be disconnected from the positive voltage supply Vdd as shown in FIG. 10. FIG. 10 is a schematic view of an n-type MOS decoupling capacitor 1000 operating in an accumulation mode according to still further another embodiment of the present disclosure, wherein the $p^+$ doped conductive regions 912 and 916 are floating.

In some embodiments, the MEOL conductive structure configuration and/or the non-doped or lightly doped MOS structure may be applied to MOS decoupling capacitors in accumulation mode. It is to be appreciated, however, that embodiments in accordance with the present disclosure are equally applicable to p-type MOS capacitors formed in N-wells with appropriate adjustments for associated configurations, such as supply voltages, and such embodiments are considered within the scope of the present invention.

Some embodiments of the present disclosure provide a metal-oxide-semiconductor (MOS) capacitor. The MOS capacitor includes a front-end-of-the-line (FEOL) field effect transistor (FET), and a plurality of middle-end-of-the-line (MEOL) conductive structures. The FEOL FET includes a source region and a drain region positioned in a semiconductor substrate, and a gate over the semiconductor substrate. The plurality of MEOL conductive structures is disposed on a top surface of the gate. At least one of the MEOL conductive structures is electrically disconnected from a back-end-of-the-line (BEOL) metal layer.

In some embodiments of the present disclosure, a top surface of each MEOL conductive structure is substantially flush with a top surface of a conductive structure disposed on the source region and a top surface of a conductive structure disposed on the drain region.

In some embodiments of the present disclosure, the MEOL conductive structures are arranged in a line parallel to a conductive structure disposed on the source region and a conductive structure disposed on the drain region.

In some embodiments of the present disclosure, at least about 20% of the top surface of the gate is covered by the MEOL conductive structures.

Some embodiments of the present disclosure provide a metal-oxide-semiconductor (MOS) capacitor. The MOS capacitor includes a front-end-of-the-line (FEOL) field effect transistor (FET), and a middle-end-of-the-line (MEOL) conductive structure. The FEOL FET includes a source region and a drain region positioned in a semiconductor substrate, and a gate over the semiconductor substrate. The plurality of MEOL conductive structures is disposed on a top surface of the gate. The MEOL conductive structure is electrically connected to a back-end-of-the-line (BEOL) metal layer.

In some embodiments of the present disclosure, a top surface of the MEOL conductive structure is substantially flush with a top surface of a conductive structure disposed on the source region and a top surface of a conductive structure disposed on the drain region.

In some embodiments of the present disclosure, an edge of the MEOL conductive structure laterally exceeds an edge of the gate.

In some embodiments of the present disclosure, at least about 20% of the top surface of the gate is covered by the MEOL conductive structure.

Some embodiments of the present disclosure provide a semiconductor fabrication method. The semiconductor fabrication method includes: obtaining a semiconductor substrate; determining a region of metal-oxide-semiconductor (MOS) decoupling capacitors on the semiconductor substrate and a region of non-decoupling capacitor circuits; and performing ion implantation upon the semiconductor substrate; wherein each device in the region of MOS decoupling capacitors has a threshold voltage lower than each device in the region of non-decoupling capacitor circuits.

In some embodiments of the present disclosure, performing ion implantation upon the semiconductor substrate includes: forming an implant mask to obstruct a channel region of each MOS decoupling capacitor from being doped; and performing ion implantation upon the semiconductor substrate via the implant mask.

In some embodiments of the present disclosure, performing ion implantation upon the semiconductor substrate includes: performing ion implantation upon the region of MOS decoupling capacitors with a dosage lower than the region of non-decoupling capacitor circuits.

In some embodiments of the present disclosure, the channel region is beneath a gate and between a source region and a drain region of each MOS decoupling capacitor.

Some embodiments of the present disclosure provide a metal-oxide-semiconductor (MOS) capacitor circuit. The MOS capacitor circuit includes a front-end-of-the-line (FEOL) field effect transistor (FET) and a biasing circuit for providing bias to the FET. The FEOL field effect transistor FET includes a source region and a drain region positioned in a semiconductor substrate, and a gate over the semiconductor substrate. The FET operates in an accumulation mode.

In some embodiments of the present disclosure, the source region and the drain region are positioned in a first diffusion region, and the first diffusion region is positioned in a second diffusion region having a polarity opposite to a polarity of the first diffusion region.

In some embodiments of the present disclosure, the second diffusion region is positioned in the semiconductor substrate having a polarity opposite to a polarity of the second diffusion region.

In some embodiments of the present disclosure, the biasing circuit supplies a first supply voltage to the first and second diffusion regions, and supplies a second supply voltage to the gate.

In some embodiments of the present disclosure, the source region and the drain region are disconnected from the first supply voltage and the second supply voltage.

In some embodiments of the present disclosure, capacitance of the MOS capacitor circuit is incurred between the first diffusion region and the gate.

In some embodiments of the present disclosure, the biasing circuit supplies a first supply voltage to the second diffusion region and at least one of the source region and the drain region, and supplies a second supply voltage to the gate.

In some embodiments of the present disclosure, capacitance of the MOS capacitor circuit is incurred between the gate and the at least one of the source region and the drain region to which the first supply voltage supplies.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A metal-oxide-semiconductor (MOS) capacitor circuit, comprising:
   a front-end-of-the-line (FEOL) field effect transistor (FET), comprising:
   a source region and a drain region positioned in a semiconductor substrate;
   a shallow trench isolation (STI) positioned in a first diffusion region only; and
   a gate over the semiconductor substrate, the shallow trench isolation (STI) being laterally abutting the gate; and
   a biasing circuit for providing bias to the FET;
   wherein the source region and the drain region are positioned in the first diffusion region, the first diffusion region is positioned in a second diffusion region having a polarity opposite to a polarity of the first diffusion region; and
   wherein the FET operates in an accumulation mode, and the biasing circuit supplies a first supply voltage to the first and second diffusion regions, and supplies a second supply voltage to the gate, wherein subtracting the first supply voltage from the second supply voltage is a negative value.

2. The MOS capacitor circuit of claim 1, wherein the semiconductor substrate having a polarity opposite to a polarity of the second diffusion region, and the second diffusion region is positioned in the semiconductor substrate.

3. The MOS capacitor circuit of claim 2, wherein the biasing circuit supplies a first supply voltage to the second diffusion region and at least one of the source region and the drain region, and supplies a second supply voltage to the gate.

4. The MOS capacitor circuit of claim 3, wherein capacitance of the MOS capacitor circuit is incurred between the gate and the at least one of the source region and the drain region to which the first supply voltage supplies.

5. The MOS capacitor circuit of claim 1, wherein the source region and the drain region are disconnected from the first supply voltage and the second supply voltage.

6. The MOS capacitor circuit of claim 1, wherein capacitance of the MOS capacitor circuit is incurred between the first diffusion region and the gate.

7. A metal-oxide-semiconductor (MOS) capacitor circuit, comprising:
   a first diffusion region;
   a second diffusion region, having a polarity opposite to a polarity of the first diffusion region;
   a first gate structure over the first diffusion region;
   a second gate structure over the first diffusion region;
   a third gate structure over the first diffusion region;
   a source region in the first diffusion region and between the first gate structure and the second gate structure;
   a drain region in the first diffusion region and between the second gate structure and the third gate structure; and
   a first conductive region in the first diffusion region, the first conductive region having a polarity the same with the polarity of the first diffusion region; and
   a first shallow trench isolation (STI) having a bottom lower than bottoms of the source region, the drain region and the first conductive region, the first STI being laterally abutting the first gate structure;
   wherein the first diffusion region is coupled to a first voltage through at least the first conductive region, the drain region is coupled to the first voltage, and the first, second and third gate structures are coupled to a second voltage lower than the first voltage, and the first, second and third gate structures and the source region and the drain region are isolated from the first conductive region by the first STI.

8. The MOS capacitor circuit of claim 7, further comprising a second conductive region in the second diffusion region, the second conductive region having a polarity the same with the polarity of the second diffusion region.

9. The MOS capacitor circuit of claim 8, wherein the second diffusion region is coupled to the first voltage through at least the second conductive region.

10. The MOS capacitor circuit of claim 7, wherein the source region and the drain region are coupled to the first voltage.

11. The MOS capacitor circuit of claim 7, wherein the source region and the drain region are disconnected from the first voltage and the second voltage.

12. The MOS capacitor circuit of claim 7, further comprising a second shallow trench isolation (STI) at an interface between the first diffusion region and the second diffusion region.

13. The MOS capacitor circuit of claim 12, wherein the first, second and third gate structures and the source region and the drain region are isolated from the second conductive region by the second STI.

14. A metal-oxide-semiconductor (MOS) capacitor circuit, comprising:
- a first diffusion region;
- a second diffusion region, having a polarity opposite to a polarity of the first diffusion region, and the first diffusion region is in the second diffusion region;
- a first gate structure over the first diffusion region;
- a second gate structure over the first diffusion region;
- a shallow trench isolation (STI) positioned in a first diffusion region only, the shallow trench isolation (STI) being laterally abutting the first gate structure; and
- a first conductive region in the first diffusion region, the first conductive region having a polarity the same with the polarity of the first diffusion region, and the first conductive region being between the first gate structure and the second gate structure, wherein the first gate structure abuts a first side of the first conductive region, and the second gate structure abuts a second side of the first conductive region, and the first side is opposite to the second side;
- wherein the first diffusion region is coupled to a first voltage through at least the first conductive region, and the first and second gate structures are coupled to a second voltage lower than the first voltage, and the MOS capacitor circuit is free from having another STI between the first gate structure and the second gate structure.

15. The MOS capacitor circuit of claim 14, further comprising:
- a third gate structure over the first diffusion region;
- a fourth gate structure over the first diffusion region, wherein the first and second gate structures are between the third and fourth gate structures;
- a second conductive region in the first diffusion region, the second conductive region having a polarity the same with the polarity of the second diffusion region, and the second conductive region being between the third gate structure and the first gate structure; and
- a third conductive region in the first diffusion region, the third conductive region having a polarity the same with the polarity of the second diffusion region, and the third conductive region being between the second gate structure and the fourth gate structure.

16. The MOS capacitor circuit of claim 15, wherein the second conductive region and the third conductive region are coupled to the first voltage.

17. The MOS capacitor circuit of claim 15, wherein the second conductive region and the third conductive region are disconnected from the first voltage.

* * * * *